United States Patent
Makino et al.

(10) Patent No.: US 9,105,451 B2
(45) Date of Patent: Aug. 11, 2015

(54) PLASMA PROCESSING METHOD AND PLASMA PROCESSING APPARATUS

(75) Inventors: Hiroyuki Makino, Kanagawa (JP); Masaru Tanaka, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 516 days.

(21) Appl. No.: 13/009,278

(22) Filed: Jan. 19, 2011

(65) Prior Publication Data

US 2012/0181252 A1    Jul. 19, 2012

(51) Int. Cl.
| | |
|---|---|
| C23F 1/00 | (2006.01) |
| H01L 21/306 | (2006.01) |
| C25F 1/00 | (2006.01) |
| C25F 3/30 | (2006.01) |
| C25F 5/00 | (2006.01) |
| H01J 37/32 | (2006.01) |

(52) U.S. Cl.
CPC ....... H01J 37/32449 (2013.01); H01J 37/3244 (2013.01); H01J 37/32412 (2013.01); H01J 37/32422 (2013.01); H01J 37/32706 (2013.01)

(58) Field of Classification Search
USPC ........... 156/345.26; 134/1.1, 8, 22.1; 438/905
See application file for complete search history.

(56) References Cited

U.S. PATENT DOCUMENTS

| | | | |
|---|---|---|---|
| 7,588,036 B2 * | 9/2009 | Cui et al. | 134/1.1 |
| 2006/0089003 A1 * | 4/2006 | Cheng et al. | 438/706 |
| 2008/0257864 A1 * | 10/2008 | Bencher et al. | 216/67 |
| 2009/0068769 A1 | 3/2009 | Okumura et al. | |
| 2011/0143170 A1 * | 6/2011 | Gouk et al. | 428/846 |

FOREIGN PATENT DOCUMENTS

| | | | | |
|---|---|---|---|---|
| EP | 1076355 | * | 2/2001 | ............. H01L 21/00 |
| JP | 5315098 A | | 11/1993 | |
| KR | 10-2007-0066390 A | | 6/2007 | |
| WO | 2006/107044 | | 10/2006 | |

* cited by examiner

Primary Examiner — Rakesh Dhingra
(74) Attorney, Agent, or Firm — Squire Patton Boggs (US) LLP

(57) ABSTRACT

A plasma processing apparatus performs generating plasma only with the carrier gas without the supply of the processing gas after the end of processing to the substrate.

3 Claims, 4 Drawing Sheets

PLASMA PROCESSING METHOD AND PLASMA PROCESSING APPARATUS

RELATED APPLICATION

The present application is based upon Japanese Patent Application No. 2008-175311, filed Jul. 4, 2008, the entire contents of which are incorporated herein by reference.

BACKGROUND

1. Field of the Invention

The present invention relates to a plasma processing method and a plasma processing apparatus which process a substrate using plasma.

2. Description of Related Art

Ion implantation (plasma doping) by plasma will be simply described as an example of plasma processing.

Generally, an ion implanting apparatus using plasma includes a vacuum container, a plasma generator which generates plasma within the vacuum container, a substrate holder on which a substrate is loaded within the vacuum container, a biasing power source (low frequency or pulse) which applies bias potential via the substrate holder, a vacuum pumping system (vacuum pump), and a processing gas supply system which supplies processing gas into the vacuum container.

The vacuum container is brought into a vacuum state by the vacuum pumping system. Thereafter, plasma is generated within the vacuum container by the plasma generator, processing gas is introduced into the vacuum container, a bias voltage is applied to the substrate holder, which has been loaded with the substrate, by a bias power source, and implantation of ions to the substrate is performed (for example, refer to Pamphlet of International Publication No. 2006/107044).

Meanwhile, when the inside of the vacuum container facing the plasma is clean, since substances ionized by the plasma are deposited on the inner wall of the vacuum container, it is considered that there is no emission of substances from the inner wall. However, as processing is repeated, substances to be processed are deposited on the inner wall, and are eventually emitted to the inside of the vacuum container by sputtering and evaporation. Since the emitted substances are again made into plasma in the plasma, the plasma density near the inner wall decreases as a consequence.

The results of plasma measurement are shown in FIG. 4. It can be seen that, as the number of steps increases, the plasma density near the inner wall of the vacuum container apart from the substrate center decreases. Since the distribution of ions which are deposited on and implanted into a substrate to be processed depends on the distribution of plasma, the heterogeneity of plasma distribution causes degradation of the homogeneity and repeatability of doping to the substrate.

SUMMARY

According to an embodiment of the present invention, there is provided a plasma processing method including generating plasma within a vacuum container, applying bias via a substrate holder on which a substrate to be processed within the vacuum container is loaded, supplying processing gas into the vacuum container and supplying carrier gas into the vacuum container. Here, the generating plasma further includes generating plasma only with the carrier gas without the supply of the processing gas after the end of processing of the substrate.

According to another embodiment of the present invention, there is provided a plasma processing apparatus including a plasma generator configured to generate plasma within a vacuum container, a biasing power source configured to apply bias via a substrate holder on which a substrate to be processed within the vacuum container is loaded, gas supply sources configured to respectively supply processing gas and carrier gas into the vacuum container, a controller configured to control the plasma generator, the biasing power source, and the gas supply sources. Here, the controller is configured to execute a control generating plasma only with the carrier gas without the supply of the processing gas after the end of processing of the substrate.

DETAILED DESCRIPTION

It is desirable to provide a plasma processing method and a plasma processing apparatus which can improve the homogeneity and repeatability of processing to a substrate irrespective of the number of steps.

Figure 1:
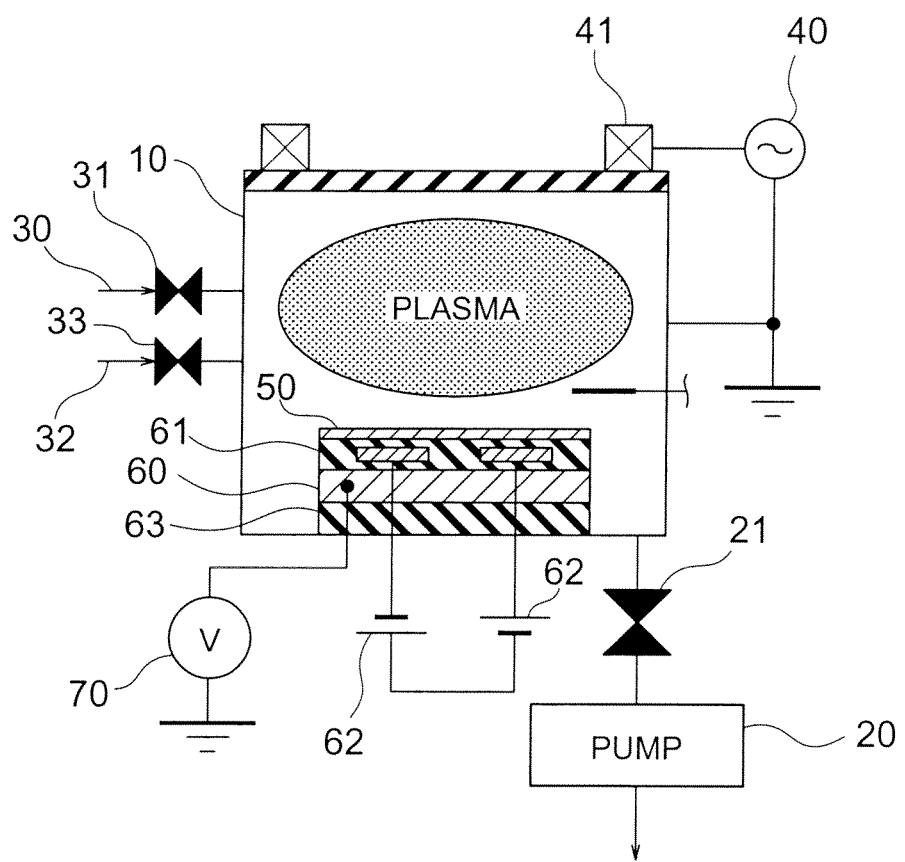
FIG. 1 is a view for illustrating the schematic configuration of an ion implanting apparatus using plasma as an example of a plasma processing apparatus to which the present invention is applied.

Referring to FIG. 1, an ion implanting apparatus (single wafer type plasma doping apparatus) using plasma as an example of a plasma processing apparatus to which the present invention is applied will be described.

A vacuum pump 20 for exhausting the inside of a vacuum container 10 into a vacuum is connected to the container via a vacuum valve 21. Additionally, a carrier gas source 30 for introducing carrier gas, such as He or Ar, into the container, and a processing gas source 32 for introducing processing gas are connected to the vacuum container 10 via valves 31 and 33, respectively. A plasma-generating coil 40 for plasma generation is set outside the vacuum container 10, and a substrate 50 to be processed, and a substrate holder 60 for allowing the substrate 50 to be placed thereon is built inside the vacuum container 10. A biasing power source 70 for generating bias potential is connected to the substrate holder 60. A plasma-generating power source 41 is connected to the plasma-generating coil 40. The vacuum container 10 is electrically connected to earth along with a plasma-generating power source 41. An electrostatic chuck 61 is loaded on the substrate holder 60 for substrate temperature management. The electrostatic chuck 61 is connected to a power source 62 for an electrostatic chuck. In addition, the substrate holder 60 is provided within the vacuum container 10 via an insulating plate 63, and is insulated electrically from the vacuum container 10.

The ion implanting apparatus is equipped with a controller, though not shown, which controls the above respective components.

When ions are implanted, a bias voltage is applied to the substrate holder 60, and the ions are accelerated by a voltage applied to the substrate holder 60.

Next, a plasma processing method according to the invention will be described comparing with a conventional example.

Figure 2:
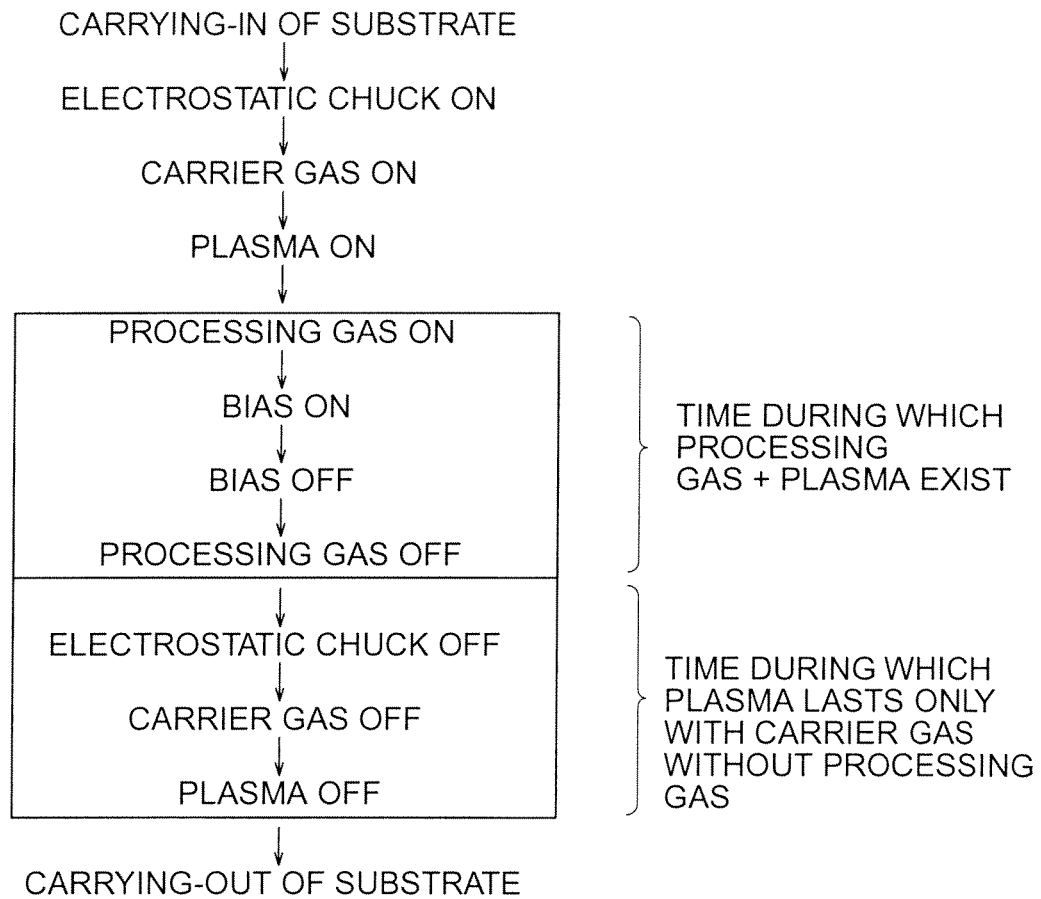
FIG. 2 is a view showing the flow of ON/OFF of plasma and bias until a processed substrate is carried out after the substrate is inserted into a vacuum container in an embodiment of the present invention.
Figure 3:
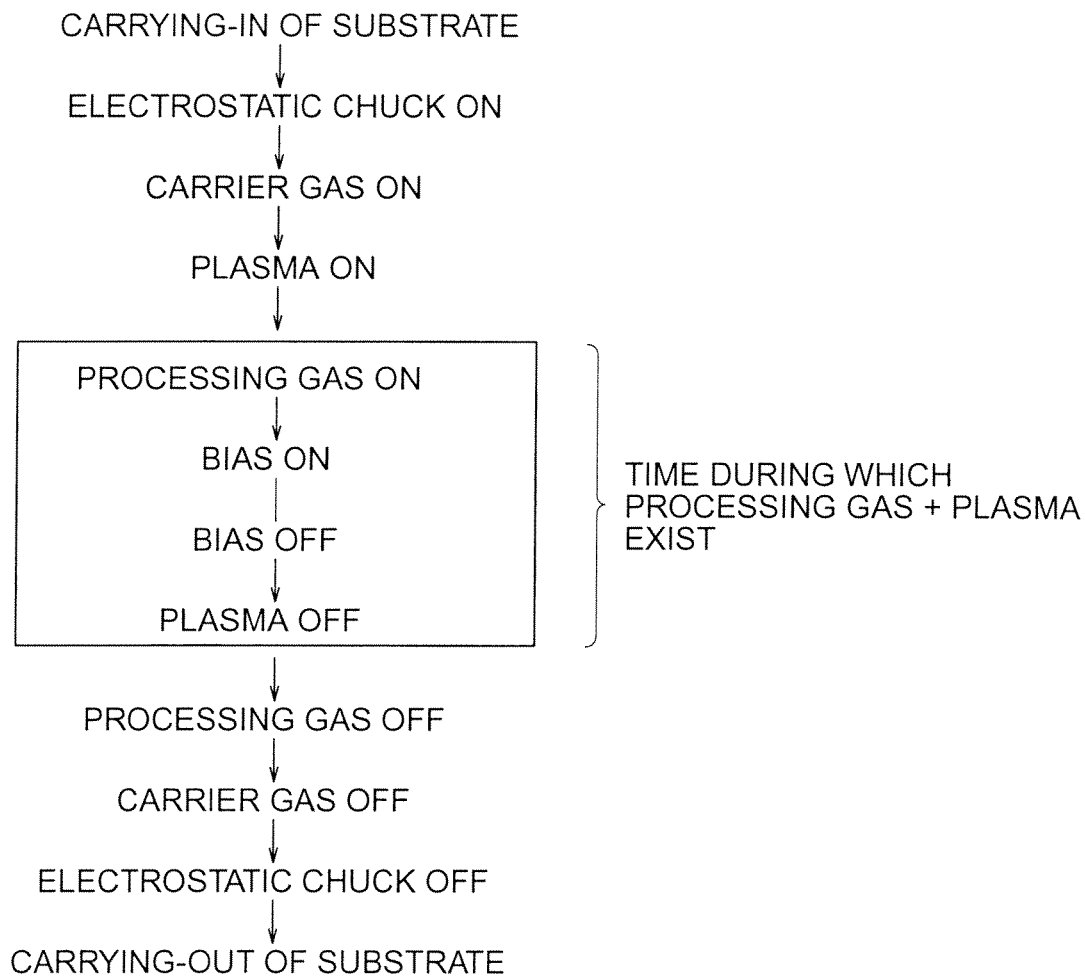
FIG. 3 is a view showing the flow of ON/OFF of plasma and bias until a processed substrate is carried out after the substrate is inserted into a vacuum container in a conventional example.
Figure 4:
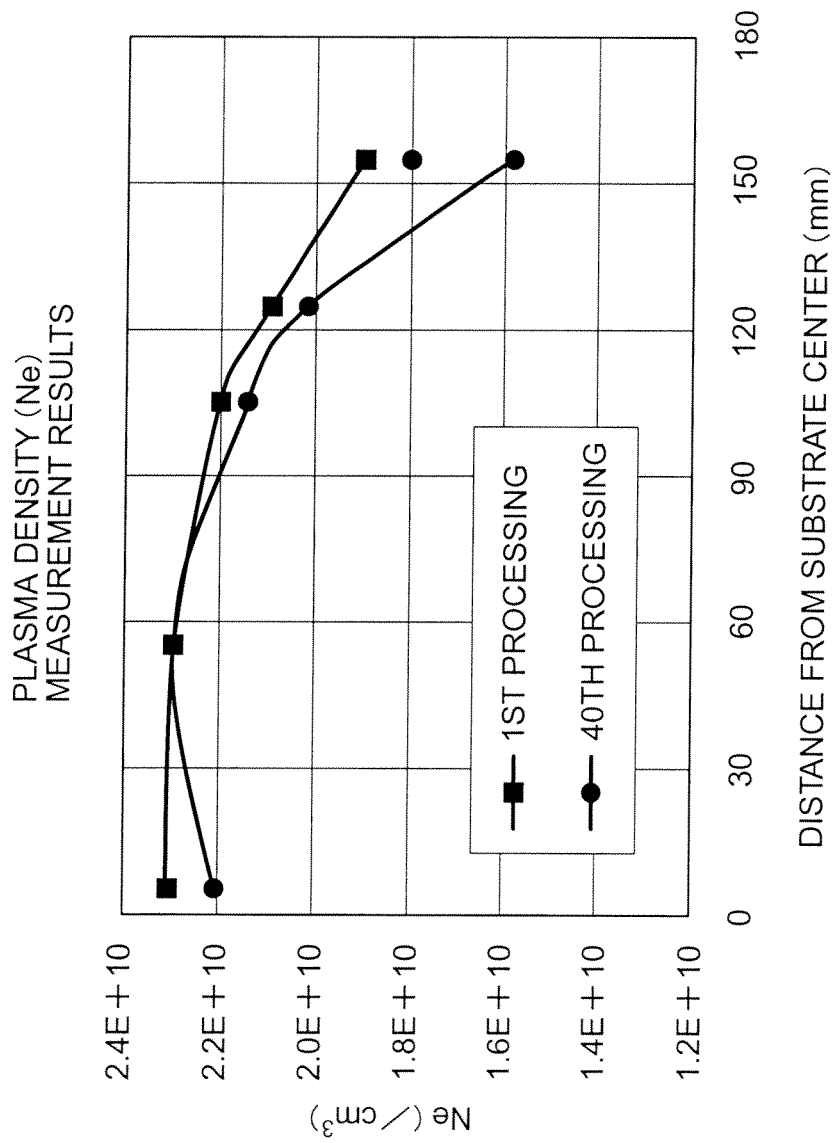
FIG. 4 is a view showing an example of the results obtained by measuring the relationship between the number of times the plasma steps are repeated, and a change in the plasma density from a substrate center.

FIGS. 2 and 3 are respectively views showing the flow of ON/OFF of plasma and bias until a processed substrate is carried out after the substrate is inserted into the vacuum container 10 in an embodiment of the present invention and a conventional example.

For convenience, when the conventional example is described using FIG. 1, in FIG. 3, the substrate 50 is loaded on the electrostatic chuck 61 within the vacuum container 10, and the power source 62 for an electrostatic chuck is set to ON. The inside of the vacuum container 10 is exhausted by the vacuum pump 20. Subsequently, carrier gas is introduced, and the pressure within the vacuum container 10 is maintained at a setting value by the vacuum valve 21. Subsequently, when the plasma-generating power source 41 is set to ON, and generation of the plasma begins, the processing gas is introduced into the vacuum container 10, and the biasing power source 70 is set to ON. Thereby, when processing to the substrate 50 begins, and the time for the processing passes and the processing ends, the substrate is carried out after the biasing power source 70 is set to OFF, the generation of the plasma is set to OFF, the introduction of the processing gas is set to OFF, the introduction of the carrier gas is set to OFF, and the power source 62 for an electrostatic chuck is set to OFF.

Among the above steps, during the steps surrounded and shown by a frame in FIG. 3, i.e., the steps from the introduction of the processing gas to the plasma generation OFF, both the processing gas and the plasma exist. During this, processed substances are deposited on the inner wall of the vacuum container 10.

On the other hand, the processing method according to an embodiment of the present invention has the following flow. The following flow is executed by a controller.

In FIG. 2, the substrate 50 is loaded on the electrostatic chuck 61 within the vacuum container 10, and the power source 62 for an electrostatic chuck (electrostatic chuck ON) is set to ON. The inside of the vacuum container 10 is exhausted by the vacuum pump 20. Subsequently, carrier gas (carrier gas ON) is introduced, and the pressure within the vacuum container 10 is maintained at a setting value by the vacuum valve 21. Subsequently, when the plasma-generating power source 41 is set to ON, and the generation of the plasma begins (plasma ON), the processing gas is introduced into the vacuum container 10 (processing gas ON), and the biasing power source 70 is set to ON (bias ON). Thereby, when processing to the substrate 50 begins, and the time for the processing passes and the processing ends, the substrate is carried out after the biasing power source 70 is set to OFF (bias OFF), the introduction of the processing gas is set to OFF (processing gas OFF), the power source 62 for an electrostatic chuck is set to OFF (electrostatic chuck OFF), the introduction of the carrier gas is set to OFF (carrier gas OFF), and the generation of the plasma is set to OFF (plasma OFF).

Even in this processing method, during the steps surrounded and shown by a frame in FIG. 2, i.e., the steps from the introduction of the processing gas to OFF of the generation of the plasma, both the processing gas and the plasma exist. During this, processed substances are deposited on the inner wall of the vacuum container 10. However, a controller is used to maintain the generation of the plasma even after the processing gas introduction is set to OFF and perform plasma continuation with carrier gas such as He or Ar while the processing gas does not exist so as to clean the processed substances which have adhered to the inner wall of the vacuum container 10. Here, the period during which plasma generation is maintained only with carrier gas without the supply of processing gas is defined as the time to OFF of the generation of the plasma after the introduction of the processing gas is set to OFF after OFF of the application of the bias. This always maintains the inner wall of the vacuum container 10 in a clean state. As a result, since a decrease in plasma density by emission of the processed substances to be deposited on the inner wall of the vacuum container 10 can be suppressed, the plasma distribution within the vacuum container 10 can be uniformly maintained irrespective of the number of times the process is repeated, and therefore, the homogeneity and repeatability of ion implanting processing to the substrate 50 can be improved Of course, the invention can be applied to any plasma processing which requires the homogeneity and repeatability of a processing to a substrate as well as ion doping.

It should be understood that the invention is not limited to the above-described embodiment, but may be modified into various forms on the basis of the concept of the invention. Additionally, the modifications are included in the scope of the invention.

What is claimed is:

1. A plasma processing apparatus comprising: a plasma generator configured to generate plasma within a vacuum container;
    a biasing power source configured to apply bias via a substrate holder on which a substrate to be processed within the vacuum container is loaded;
    gas supply sources configured to respectively supply processing gas and He gas as carrier gas into the vacuum container; and
    a controller configured to control the plasma generator, the biasing power source, and the gas supply sources, such that a plasma is generated with the carrier gas;
    wherein the controller is configured to and maintain the generated plasma so as to clean processed substances which have adhered to an inner wall of the vacuum container, and perform plasma continuation only with the carrier gas and without the supply of the processing gas, after the end of processing of the substrate.

2. The plasma processing apparatus according to claim 1, wherein the controller is configured to execute the processing of the substrate by introducing the processing gas and applying the bias after the carrier gas is introduced and the generation of the plasma is set to ON, and when the processing of the substrate ends, execute carrying-out of the substrate after the application of the bias is set to OFF, the introduction of the processing gas is set to OFF, the introduction of the carrier gas is set to OFF, and the generation of the plasma is set to OFF.

3. The plasma processing apparatus according to claim 1, wherein the controller is configured to execute the control maintaining the generated plasma only with the carrier gas and without the supply of the processing gas until the generation of the plasma is set to OFF after the introduction of the processing gas is set to OFF.

* * * * *